(12) United States Patent
Goto et al.

(10) Patent No.: US 9,806,284 B2
(45) Date of Patent: Oct. 31, 2017

(54) DISPLAY DEVICE

(71) Applicant: Japan Display Inc., Minato-ku (JP)

(72) Inventors: Yusuke Goto, Minato-ku (JP); Takashi Saeki, Minato-ku (JP); Toshihiro Sato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/293,907

(22) Filed: Oct. 14, 2016

(65) Prior Publication Data

US 2017/0148857 A1    May 25, 2017

(30) Foreign Application Priority Data

Nov. 20, 2015  (JP) .................................. 2015-227554

(51) Int. Cl.
| | |
|---|---|
| *H01J 1/62* | (2006.01) |
| *H01L 51/52* | (2006.01) |
| *H01L 51/00* | (2006.01) |
| *H01L 27/32* | (2006.01) |

(52) U.S. Cl.
CPC ...... *H01L 51/5246* (2013.01); *H01L 27/3244* (2013.01); *H01L 51/0097* (2013.01); *H01L 51/5253* (2013.01); *H01L 2251/5338* (2013.01)

(58) Field of Classification Search
CPC ............. H01L 51/5246; H01L 51/0097; H01L 51/5253; H01L 27/3244; H01L 2251/5338
USPC .......................................... 313/511, 512, 506
See application file for complete search history.

(56) References Cited

U.S. PATENT DOCUMENTS

| | | | |
|---|---|---|---|
| 7,241,666 B2 * | 7/2007 | Goto ................... | H01L 27/1214 257/E21.122 |
| 2015/0041766 A1 * | 2/2015 | Naijo ................... | H01L 27/3244 257/40 |

FOREIGN PATENT DOCUMENTS

| | | |
|---|---|---|
| JP | 2007-27222 | 2/2007 |
| JP | 2010-98645 | 4/2010 |
| KR | 10-2014-0118676 A | 10/2014 |

OTHER PUBLICATIONS

Office Action dated Jun. 14, 2017 in Korean Patent Application No. 10-2016-0132857 (with English translation).

* cited by examiner

*Primary Examiner* — Vip Patel
(74) *Attorney, Agent, or Firm* — Oblon, McClelland, Maier & Neustadt, L.L.P.

(57) ABSTRACT

A bent part is prevented from being damaged by preventing displacement of a bend. A display device includes a circuit substrate having a flat part and a bent part, a light emitting element layer disposed on each of unit pixels forming an image, a circuit layer stacked on an outside surface of the bent part, a sealing layer that covers and seals the light emitting element layer, and a double-sided tape that includes a base material having a first surface and a second surface, respectively provided with a first adhesive and a second adhesive, and is bent at an inside of the bent part of the circuit substrate with the first surface being outside. The first surface sticks to the circuit substrate, and the second surface is folded back and adhered together.

19 Claims, 9 Drawing Sheets

DISPLAY DEVICE

CROSS-REFERENCE TO RELATED APPLICATION

The present application claims priority from Japanese application JP2015-227554 filed on Nov. 20, 2015, the content of which is hereby incorporated by reference into this application.

BACKGROUND OF THE INVENTION

1. Field of the Invention

The present invention relates to a display device.

2. Description of the Related Art

Recently, there has been an increasing need for narrowing a frame area, which is an outer peripheral area of a display area for displaying images, in order to downsize a display device or expand the display area. Wirings and circuits are formed on the frame area. In particular, demand for a narrower frame has been increasing in mobile devices such as smartphones. However, ideas for narrowing frames appear to have been exhausted, and thus another method to address a narrower frame is required.

As such, using a flexible display and folding its frame area back is considered in order to substantially narrow a frame. JP2010-098645A discloses a flexible display including a flexible resin substrate on which a circuit layer and an organic electroluminescent layer are formed.

When a frame area of a flexible display is bent in too small curvature radius, a wiring disconnection or damage on a circuit may occur. As such, bending needs to be controlled within an allowable range. JP2007-027222A discloses a flexible printed circuit board that prevents a bent part from being disconnected by using regulation films, to thereby improve reliability. However, further improvement is required because a regulation range of bending is changed due to displacement of regulation films.

SUMMARY OF THE INVENTION

One or more embodiments of the present invention have been conceived in view of the above, and an object thereof is to avoid damage to a bend by preventing displacement of a bent part.

A display device according to the present invention includes a substrate that includes a flat part and a bent part, a circuit layer that includes a light emitting element layer disposed on each of a plurality of unit pixels forming an image in an area corresponding to the flat part, the circuit layer being stacked on an outside surface of the bent part, a sealing layer that covers and seals the light emitting element layer, a double-sided tape that includes a base material having a first surface and a second surface, the first surface being provided with a first adhesive, the second surface being provided with a second adhesive, and the double-sided tape being bent at an inside of the bent part of the substrate with the first surface being outside. The first surface sticks to the substrate with the first adhesive, and the second surface is folded back and adhered together with the second adhesive.

The display device according to the present invention includes a bent substrate, a circuit layer that includes a plurality of unit pixels forming an image and is stacked on an outside surface of a bend of the substrate, a sealing layer that covers and seals the circuit layer, and a double-sided tape that includes a base material having an adhesive on each of a first surface and a second surface, and is bent at an internal of the bend of the substrate with the first surface being outside. The first surface sticks to the substrate, and the second surface is folded back and adhered together.

The display device according to the present invention, in which the substrate includes a flat part and a bent part, the circuit layer includes a plurality of unit pixels disposed in an area corresponding to the flat part, the circuit layer is disposed on an outside surface of the bent part of the substrate, the adhesive includes a first adhesive and a second adhesive, the first surface is provided with the first adhesive, the second surface is provided with the second adhesive, the base material is bent at an internal of the bent part of the substrate with the first surface being outside, the first surface sticks to the substrate with the first adhesive, and the second surface is folded back and adhered together with the second adhesive.

According to the present invention, the double-sided tape can prevent the bend from being displaced, and a spacer obtained by folding back the double-sided tape can prevent the bent part from being damaged.

DETAILED DESCRIPTION OF THE INVENTION

An embodiment of the present invention will be described below with reference to the accompanying drawings.

First Embodiment

Figure 1:
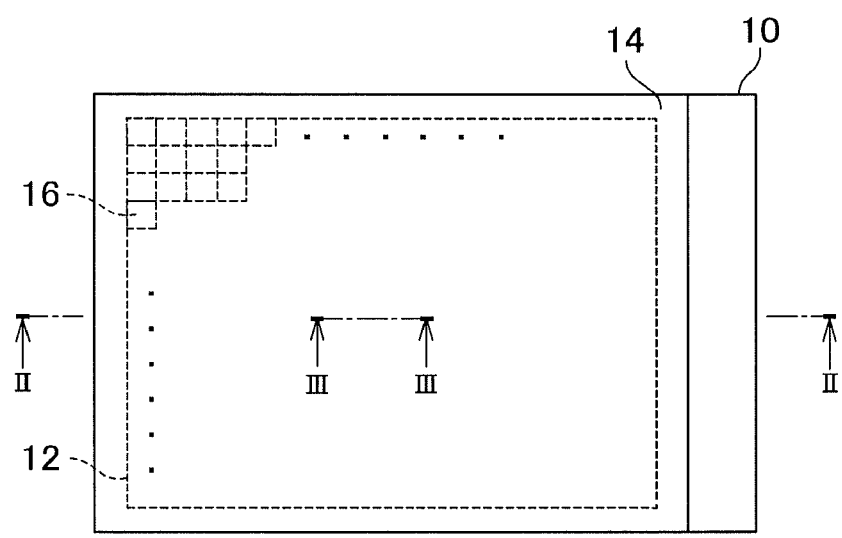
FIG. 1 is a schematic diagram illustrating a display device according to first embodiment of the present invention.
Figure 2:
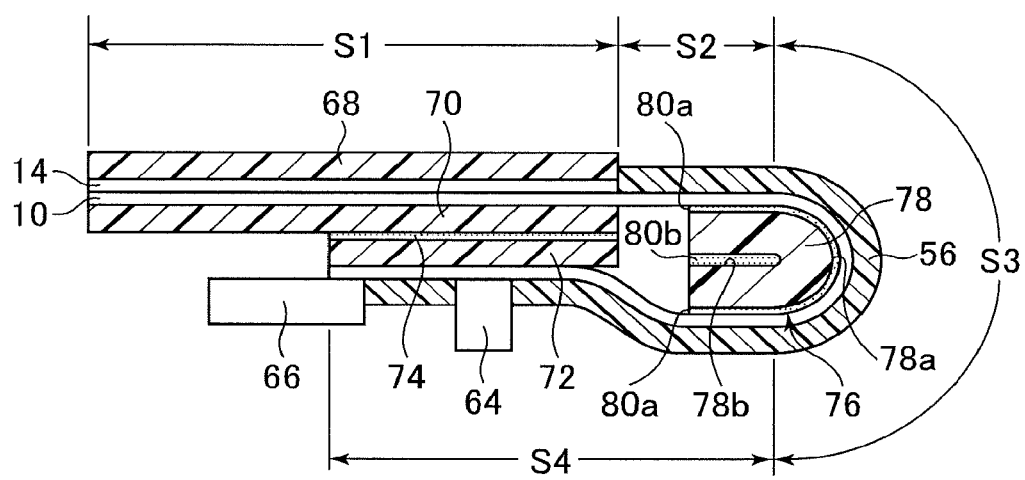
FIG. 2 is a cross-sectional view taken from the line II-II of the display device shown in FIG. 1.

FIG. 1 is a schematic diagram illustrating a display device according to the first embodiment of the present invention. FIG. 2 is a cross-sectional view taken from the line II-II of the display device shown in FIG. 1. An organic electroluminescent display device will be taken as an example of the display device. The display device includes a circuit substrate 10. A counter substrate 14 including a display area 12 is stacked on the circuit substrate 10. On the display area 12, an image formed by a plurality of unit pixels 16 consisting of light.

Figure 3:
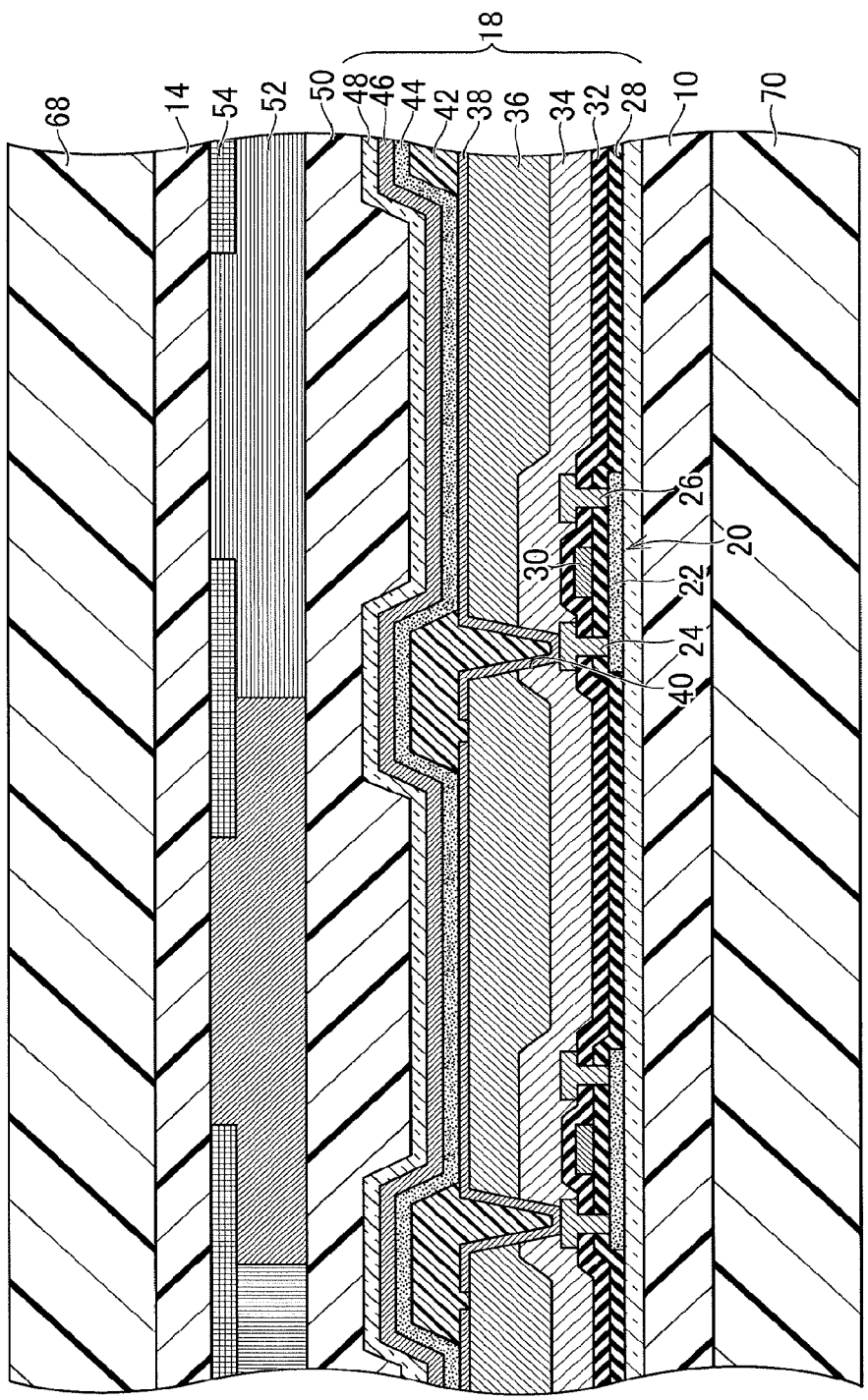
FIG. 3 is an enlarged cross-sectional view taken from the line of the display device shown in FIG. 1.

FIG. 3 is an enlarged cross-sectional view taken from the line III-III of the display device shown in FIG. 1. A circuit layer 18 is stacked on the circuit substrate 10. The circuit layer 18 includes a circuit that corresponds to respective unit pixels 16 constituting an image and controls electric current. A thin film transistor 20, which is a part of the circuit, includes a semiconductor layer 22. A source electrode 24 and a drain electrode 26 are provided on the semiconductor layer 22. A gate insulating film 28 is formed so as to cover the semiconductor layer 22, and a gate electrode 30 is formed on the gate insulating film 28. An insulating interlayer 32 is formed so as to cover the gate electrode 30. The source electrode 24 and the drain electrode 26 pass through the gate insulating film 28 and the insulating interlayer 32. The thin film transistor 20 includes the semiconductor layer 22, the source electrode 24, the drain electrode 26, and the gate electrode 30. A passivation film 34 is provided so as to cover the thin film transistor 20.

A flattening layer 36 is disposed on the passivation film 34. A plurality of pixel electrodes 38 are disposed on the flattening layer 36 so as to respectively correspond to the unit pixels 16. The flattening layer 36 is formed such that at least a surface on which the pixel electrodes 38 are disposed is flat. A pixel electrode 38 includes, for example, a lower layer that reflects light and an upper layer that transmits light, and is configured to reflect light. The pixel electrode 38 is electrically connected to one of the source electrode 24 and the drain electrode 26 on the semiconductor layer 22 via a contact hole 40 through the flattening layer 36, the passivation film 34, and the insulating interlayer 32.

An insulating layer 42 is formed on the flattening layer 36 and the pixel electrode 38. The insulating layer 42 is disposed on a perimeter of the pixel electrode 38, and formed so as to make an opening on a part (e.g., the center) of the pixel electrode 38. The insulating layer 42 forms a bank that surrounds a part of the pixel electrode 38.

A light emitting element layer 44 is disposed on the pixel electrode 38. The light emitting element layer 44 is continuously disposed over the plurality of pixel electrodes 38, and also disposed over the insulating layer 42. As a variation, a light emitting element layer 44 may be provided to each (separated) pixel electrode 38. The light emitting element layer 44 includes at least a light emitting layer, and may further include at least one of an electron transport layer, a hole transport layer, an electron injection layer, and a hole injection layer.

A common electrode 46 (e.g., cathode) is provided on the light emitting element layer 44 such that the common electrode 46 contacts with the light emitting element layer 44 on the plurality of pixel electrodes 38. The common electrode 46 is formed so as to be disposed on the insulating layer 42, which is a bank. The light emitting element layer 44 is disposed between the pixel electrode 38 and the common electrode 46, controlled in brightness by an electric current that flows between them, and emits light.

The light emitting element layer 44 is covered by the sealing layer 48 stacked on the common electrode 46, and is thus sealed and protected from moisture. A counter substrate 14 is provided on the sealing layer 48 via a filler layer 50. The counter substrate 14 has colored layers 52 including a plurality of colors (e.g., blue, red, and green), and a black matrix 54 is formed of metal or resin between two adjacent colored layers 52 indifferent colors, and serves as a color filter. The counter substrate 14 may be a touch panel, or include a polarizing plate or a retardation plate.

In FIG. 2, the counter substrate 14 is provided on a first section S1 of the circuit substrate 10. The first section S1 is flat. The circuit substrate 10 has a second section S2 adjacent to the first section S1. The second section S2 is located outside of the counter substrate 14 and flat.

The circuit substrate 10 has a third section S3 that is adjacent to the second section S2 and bent. The circuit substrate 10 is bent at the third section S3. The circuit layer 18 is stacked on an outside surface of the bend of the circuit substrate 10. The circuit substrate has a fourth section S4 adjacent to the third section S3. The fourth section S4 is flat and opposes to the second section S2. A resin layer 56 is provided over the circuit layer 18 from the second section S2 to the fourth section S4.

Figure 4:
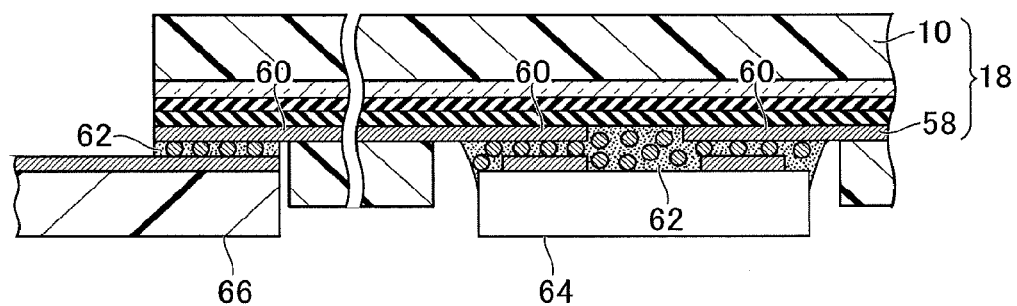
FIG. 4 is an enlarged cross-sectional view of a fourth section of a circuit substrate.

FIG. 4 is an enlarged cross-sectional view of the fourth section S4 of the circuit substrate 10. The circuit layer 18 has a wiring 58 extending from the first section S1 via the second section S2 and the third section S3, and leading to the fourth section S4. The wiring 58 is formed in the same layer as that of, for example, the source electrode 24 and the drain electrode 26. The wiring 58 has terminals 60. The terminals 60 are electrically connected with an integrated circuit chip 64 or a flexible substrate 66 via an anisotropic conductive film 62. The wiring 58 is located between the underlying circuit substrate 10 and the overlying resin layer 56 (FIG. 2). As such, the wiring 58 is located at the midway in the direction of the thickness of the stack structure and thus reduces a displacement of expansion and contraction due to bending. This enables to prevent the wiring 58 from being disconnected.

As shown in FIG. 2, a first supporting film 68 is stuck onto the counter substrate 14 for strength. A second supporting film 70 is stuck onto a surface of the circuit substrate 10 (first section S1) opposite to the circuit layer 18 for strength. A third supporting film 72 is stuck onto a fourth section S4 of the circuit substrate 10. Opposing surfaces of the second supporting film 70 and the third supporting film 72 are adhered together with an adhesive 74.

As shown in FIG. 2, the display device has a double-sided tape 76. The double-sided tape 76 has a base material 78, and a first surface 78a and a second surface 78b of the base material 78 are respectively provided with adhesives 80a and 80b. The double-sided tape 76 is bent at the inside of the bend of the circuit substrate 10 with the first surface 78a being outside. The first surface 78a sticks to the circuit substrate 10, and the second surface 78b is folded back and stuck together. In this shape, the double-sided tape 76 serves as a spacer for restricting the curvature radius of the bend of the circuit substrate 10 from being too small. The outer curved surface of the spacer can be easily formed by simply folding back the double-sided tape 76.

The base material 78 is prepared in a thickness corresponding to a size as a spacer. In a manufacturing process, prior to bend the circuit substrate 10, the second section S2, the third section S3, and the fourth section S4 of the circuit substrate 10 are stuck on the first surface 78a of the double-sided tape 76. Subsequently, while circuit substrate 10 is being bent, the double-sided tape is folded back and stuck together. Specifically, the double-sided tape 76 is folded back such that a part that sticks to the second section S2 and a part that sticks to the fourth section S4 are stuck together on the second surface 78b.

The double-sided tape 76 is folded back such that edge surfaces on the respective edges are flush with each other. Specifically, the double-sided tape 76 is folded back such that the edges that respectively stick to the second section S2 and the fourth section S4 are aligned. This allows the edge surfaces on the respective edges are positioned at an angle perpendicular to the surfaces of the second section S2 and the fourth section S4.

According to this embodiment, the double-sided tape 76 is stuck to the circuit substrate 10 in advance, and thus, when the circuit substrate 10 is bent subsequently, the double-sided tape 76 can prevent the bend of the circuit substrate 10 from being displaced, and the spacer obtained by folding back the double-sided tape 76 can prevent the bent part from being damaged.

Second Embodiment

Figure 5:
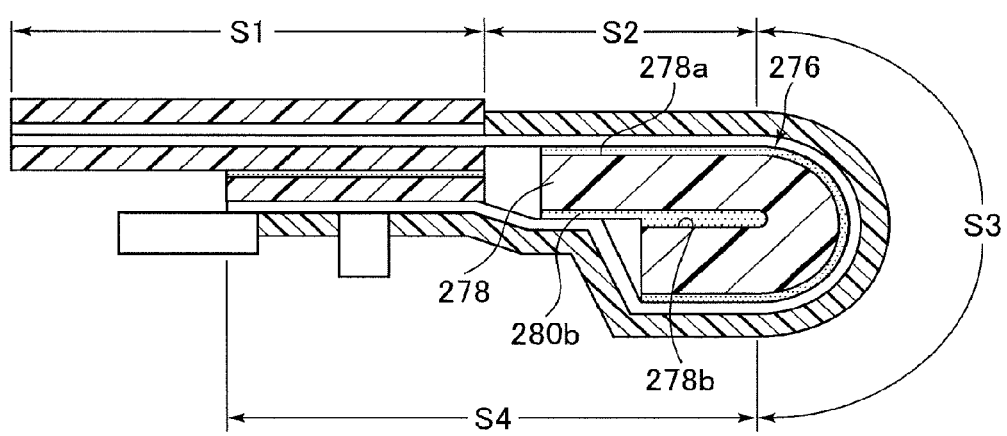
FIG. 5 is a schematic cross-sectional view of the display device according to second embodiment of the present invention.

FIG. 5 is a schematic cross-sectional view illustrating the display device according to second embodiment of the present invention. In this embodiment, the double-sided tape 276 is folded back such that the edge surface on the side that sticks to the second section S2 projects from the edge surface on the side that sticks to the fourth section S4. Specifically, one end of the base material 278 projects from the other end of the base material 278. The second surface 278b of the projecting end part of the base material 278 has an adhesive 280b, to which the circuit substrate 10 is stuck.

At the inside of the bend of the circuit substrate 10, the edges of the folded double-sided tape 276 form two steps. Specifically, a step between the first surface 278a of the base material 278 (a part of the first surface 278a that sticks to the fourth section S4) and the second surface 278b (a part of the second section S2 that sticks to the second surface 278b), and a step between a part of the second surface 278b that sticks to the second section S2 and the internal surface of the second section S2 (a surface that sticks to the first surface 278a) are formed.

The double-sided tape 276 is a spacer for restricting the circuit substrate 10 from being bent, and also a supporter for supporting the fourth section S4. The two steps are formed between the second section S2 and the fourth section S4, and thus the fourth section S4 can be mildly bent and stuck to the adhesive 280b.

Third Embodiment

Figure 6:
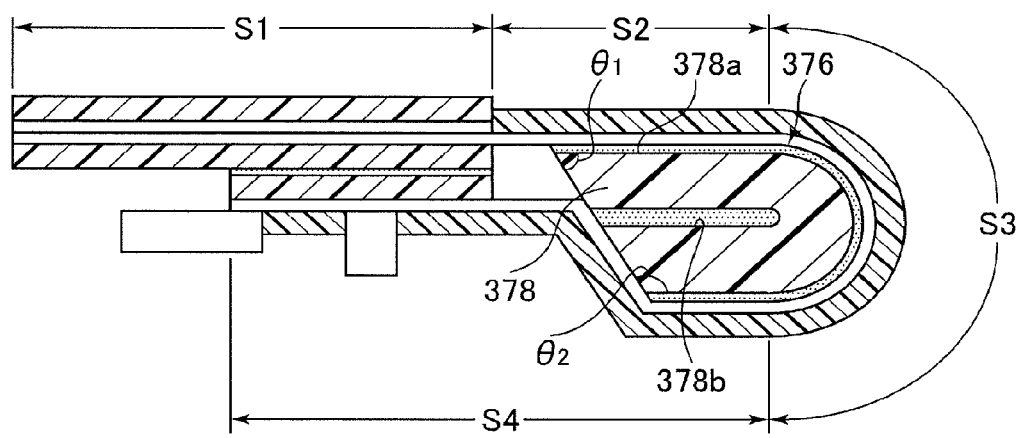
FIG. 6 is a schematic cross-sectional view of the display device according to third embodiment of the present invention.

FIG. 6 is a schematic cross-sectional view illustrating the display device according to third embodiment of the present invention. In this embodiment, the base material 378 of the double-sided tape 376 has angles, which are formed by the first surface 378a and the respective edge surfaces and include an acute angle θ1 on the side that sticks to the second section S2 and an obtuse angle θ2 on the side that sticks to the fourth section S4.

Figure 7:
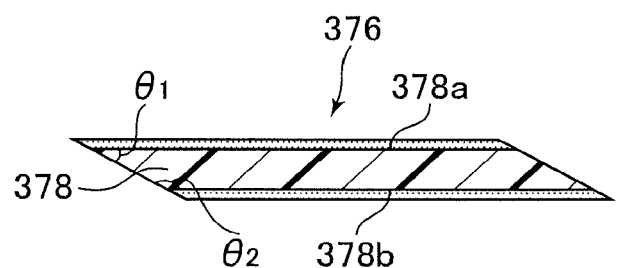
FIG. 7 is a diagram illustrating a double-sided tape shown in FIG. 6 in a flat state.

FIG. 7 is a diagram illustrating the double-sided tape 376 shown in FIG. 6 in a flat state. The respective edge surfaces of the double-sided tape 376 are oblique to the first surface 378a and the second surface 378b, and parallel to each other. The first surface 378a on the side that forms the acute angle θ1 of the double-sided tape 376 is stuck to the second section S2, and the first surface 378a on the side that forms the obtuse angle θ2 is stuck to the fourth section S4, and the double-sided tape 376 is folded back as shown in FIG. 6. According to this embodiment, the respective edge surfaces of the double-sided tape 376 are oblique and flush with each other, which enables to mildly bend the circuit substrate 10.

Fourth Embodiment

Figure 8:
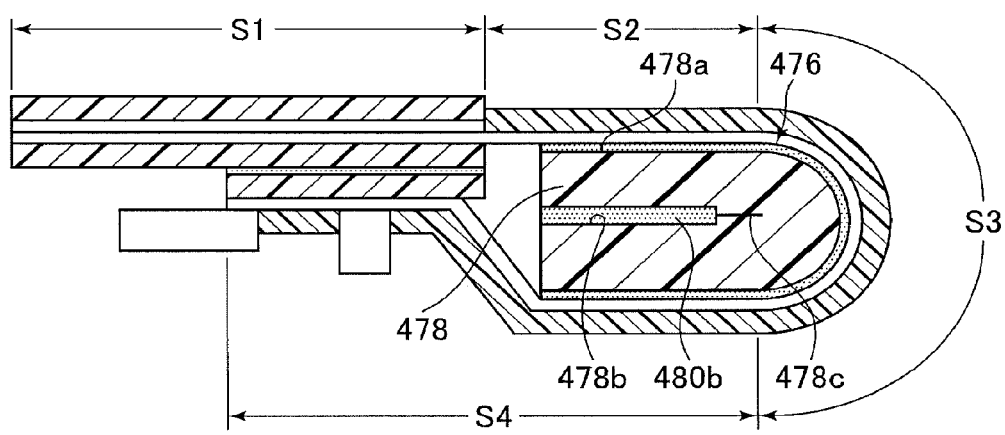
FIG. 8 is a schematic cross-sectional view of the display device according to fourth embodiment of the present invention.
Figure 9:
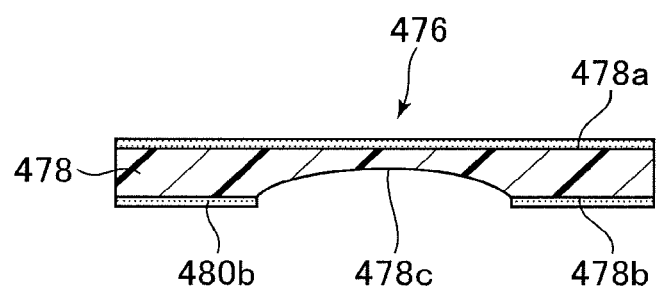
FIG. 9 is a diagram illustrating a double-sided tape shown in FIG. 8 in a flat state.

FIG. 8 is a schematic cross-sectional view illustrating the display device according to fourth embodiment of the present invention. FIG. 9 is a diagram illustrating the double-sided tape 476 shown in FIG. 8 in a flat state. As shown in FIG. 9, the base material 478 of the double-sided tape 476 has a thin part 478c, which is thinner than other parts, at the center and not at the both ends. The thin part 478c is formed by recessing the second surface 478b, and the first surface 478a is flat. The adhesive 480b is provided on the second surface 478b in a way to avoid the recess that forms the thin part 478c. The double-sided tape 476 shown in FIG. 9 is folded back as shown in FIG. 8. The base material 478 of the double-sided tape 476 has the thin part 478c at the bend of the fold.

When the double-sided tape 476 is bent, a force is applied to the inside of the double-sided tape 476 in a contracting direction. In other words, the double-sided tape 476 folded in two is applied with more pressure on a point that is closer to the center of the bend. The base material 478 of the double-sided tape 476 resists against such force, and thus the bent part of the double-sided tape 476 folded in two expands. When the bent part expands, the wiring 58 (FIG. 4) outside the bending is applied with a pulling force. Such pulling force may cause the wiring 58 to be disconnected. To prevent this disconnection, a recess is formed in advance at a position to be the center of the bend of the double-sided tape 476. This provides an effect for preventing the bent part from expanding and being disconnected. The double-sided tape 476 is easily bent at the recess, thereby also providing an advantage that a bending position can be controlled.

The display device is not limited to an organic electroluminescent display device, and may be a display device in which each pixel has a light emitting element such as a quantum-dot light emitting diode (QLED), or a liquid crystal display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a substrate that includes a flat part and a bent part;
   a circuit layer that includes a light emitting element layer disposed on each of a plurality of unit pixels in an area corresponding to the flat part, the circuit layer being stacked on an outside surface of the bent part;
   a sealing layer that covers and seals the light emitting element layer;
   a double-sided tape that includes a base material having a first surface and a second surface, the first surface being provided with a first adhesive, the second surface being provided with a second adhesive, and the double-sided tape being bent at an inside of the bent part of the substrate with the first surface being outside, wherein
   the first surface sticks to the substrate with the first adhesive, and
   the second surface is folded back and adhered together with the second adhesive.

2. The display device according to claim 1, wherein
   the substrate includes a first section provided with the light emitting element layer, a second section adjacent to the first section, a third section that is the bent part being bent and adjacent to the second section, and a fourth section adjacent to the third section, and
   the double-sided tape sticks to the second section, the third section, and the fourth section with the first surface, and is folded back such that a part sticking to the second section and apart sticking to the fourth section are adhered together on the second surface.

3. The display device according to claim 2,
wherein the double-sided tape is folded back such that respective edges sticking to the second section and the fourth section are aligned.

4. The display device according to claim 3,
wherein the double-sided tape is folded back such that edge surfaces on the respective edges are flush with each other.

5. The display device according to claim 4,
wherein the edge surfaces on the respective edges are positioned at an angle perpendicular to surfaces of the second section and the fourth section.

6. The display device according to claim 4,
wherein the double-sided tape has angles that are formed by the first surface and the respective edge surfaces, the angles including an acute angle on a side that sticks to the second section and an obtuse angle on a side that sticks to the fourth section.

7. The display device according to claim 2,
wherein the double-sided tape is folded back such that the edge surface on the side that sticks to the second section projects from the edge surface on the side that sticks to the fourth section.

8. The display device according to claim 1,
wherein the base material of the double-sided tape includes a thin part at the bend of a fold, the thin part being thinner than other parts of the base material.

9. The display device according to claim 8,
wherein the second adhesive is provided on the second surface so as to avoid the thin part.

10. A display device comprising:
a bent substrate;
a circuit layer that includes a plurality of unit pixels and is stacked on an outside surface of a bend of the substrate;
a sealing layer that covers and seals the circuit layer; and
a double-sided tape that includes a base material having an adhesive on each of a first surface and a second surface, and is bent at an internal of the bend of the substrate with the first surface being outside, wherein
the first surface sticks to the substrate, and
the second surface is folded back and adhered together.

11. The display device according to claim 10, wherein
the substrate includes a flat part and a bent part,
the circuit layer includes a plurality of unit pixels disposed in an area corresponding to the flat part,
the circuit layer is disposed on an outside surface of the bent part of the substrate;
the adhesive includes a first adhesive and a second adhesive,
the first surface is provided with the first adhesive,
the second surface is provided with the second adhesive,
the base material is bent at an internal of the bent part of the substrate with the first surface being outside,
the first surface sticks to the substrate with the first adhesive, and
the second surface is folded back and adhered together with the second adhesive.

12. The display device according to claim 11, wherein
the substrate includes a first section provided with a light emitting element layer, a second section adjacent to the first section, a third section that is the bent part being bent and adjacent to the second section, and a fourth section adjacent to the third section, and
the double-sided tape sticks to the second section, the third section, and the fourth section with the first surface, and is folded back such that a part sticking to the second section and apart sticking to the fourth section are adhered together on the second surface.

13. The display device according to claim 12,
wherein the double-sided tape is folded back such that respective edges sticking to the second section and the fourth section are aligned.

14. The display device according to claim 13,
wherein the double-sided tape is folded back such that edge surfaces on the respective edges are flush with each other.

15. The display device according to claim 14,
wherein the edge surfaces on the respective edges are positioned at an angle perpendicular to surfaces of the second section and the fourth section.

16. The display device according to claim 14,
wherein the double-sided tape has angles that are formed by the first surface and the respective edge surfaces, the angles including an acute angle on a side that sticks to the second section and an obtuse angle on a side that sticks to the fourth section.

17. The display device according to claim 12,
wherein the double-sided tape is folded back such that the edge surface on the side that sticks to the second section projects from the edge surface on the side that sticks to the fourth section.

18. The display device according to claim 11,
wherein the base material of the double-sided tape includes a thin part at the bend of a fold, the thin part being thinner than other parts of the base material.

19. The display device according to claim 18,
wherein the second adhesive is provided on the second surface so as to avoid the thin part.

* * * * *